US009666667B2

(12) United States Patent
Steeneken et al.

(10) Patent No.: US 9,666,667 B2
(45) Date of Patent: May 30, 2017

(54) APPARATUSES AND METHODS INCLUDING A SUPERJUNCTION TRANSISTOR

(71) Applicant: NXP B.V., Eindhoven (NL)

(72) Inventors: Peter Steeneken, Valkenswaard (NL); Anco Heringa, Waalre (NL); Radu Surdeanu, Leuven (BE); Luc Van Dijk, Nijmegen (NL); Hendrik Johannes Bergveld, Eindhoven (NL)

(73) Assignee: NXP B.V., Eindhoven (NL)

( * ) Notice: Subject to any disclaimer, the term of this patent is extended or adjusted under 35 U.S.C. 154(b) by 158 days.

(21) Appl. No.: 14/714,124

(22) Filed: May 15, 2015

(65) Prior Publication Data
US 2015/0357407 A1 Dec. 10, 2015

(30) Foreign Application Priority Data

Jun. 9, 2014 (EP) .................................. 14171663

(51) Int. Cl.
*H02M 7/537* (2006.01)
*H01L 29/06* (2006.01)
(Continued)

(52) U.S. Cl.
CPC ...... *H01L 29/0634* (2013.01); *H01L 29/0649* (2013.01); *H01L 29/41758* (2013.01);
(Continued)

(58) Field of Classification Search
CPC ............ H01L 29/0634; H01L 29/4238; H01L 29/41758; H01L 29/0649; H01L 29/42356;
(Continued)

(56) References Cited

U.S. PATENT DOCUMENTS

| 6,528,849 | B1 | 3/2003 | Khemka et al. |
| 2011/0074493 | A1* | 3/2011 | Denison ............. H01L 29/7831 327/536 |
| 2012/0102443 | A1 | 4/2012 | Liu et al. |

FOREIGN PATENT DOCUMENTS

| EP | 1 026 750 A1 | 8/2000 |
| JP | 2013-175728 A | 9/2013 |

OTHER PUBLICATIONS

Poli, S. et al. "TCAD optimization of a dual N/P-LDMOS transistor", Proc. of the European Solid State Device Research Conf., pp. 247-250 (Sep. 2011).

(Continued)

*Primary Examiner* — Selim Ahmed
(74) *Attorney, Agent, or Firm* — Rajeev Madnawat

(57) ABSTRACT

Aspects of the present disclosure are directed toward apparatuses, methods, and systems that include at least two regions of a first semiconductor material and at least two regions of second semiconductor material that are alternatively interleaved. Additionally, the apparatuses, methods, and systems include a first electrode and a second electrode that can operate both as a source and drain. The apparatuses, methods, and systems also include a first gate electrode having multiple portions on the first semiconductor material and a second gate electrode having multiple portions on the second semiconductor material that bidirectionally control current flow between the first electrode and the second electrode.

20 Claims, 6 Drawing Sheets

(51) Int. Cl.
 *H01L 29/417* (2006.01)
 *H02M 5/00* (2006.01)
 *H02M 3/00* (2006.01)
 *H03K 17/687* (2006.01)
 *H01L 29/423* (2006.01)

(52) U.S. Cl.
 CPC .......... *H01L 29/4238* (2013.01); *H02M 3/00* (2013.01); *H02M 5/00* (2013.01); *H02M 7/537* (2013.01); *H03K 17/687* (2013.01); *H01L 29/42356* (2013.01)

(58) Field of Classification Search
 CPC .......... H02M 7/537; H02M 3/00; H02M 5/00; H03K 17/687
 See application file for complete search history.

(56) References Cited

OTHER PUBLICATIONS

Garcia I Tormo, A. et al. "An Enhanced Switching Policy for Buck-Derived Multi-Level Switching Power Amplifiers", Proc. of IEEE Intl. Symp. on Circuits and Systems (ISCAS), pp. 3196-3199 (2010).
Udrea, F. et al. "3D RESURF Double-Gate MOSFET: a Revolutionary Power Device Concept", Electronics Letters, vol. 34, No. 8, pp. 808-809 (Apr. 16, 1998).
Deboy, G. et al. A New Generation of High Voltage MOSFETs Breaks the Limit Line of Silicon, Intl. Electron Devices Technical Digest, pp. 683-685 (Dec. 1998).
Extended European Search Report for EP Patent Appln. No. 14171663.9 (Dec. 2, 2014).

\* cited by examiner

APPARATUSES AND METHODS INCLUDING A SUPERJUNCTION TRANSISTOR

CROSS-REFERENCE TO RELATED APPLICATIONS

This application claims the priority under 35 U.S.C. §119 of European patent application no. 14171663.9, filed on Jun. 9, 2014, the contents of which are incorporated by reference herein.

BACKGROUND

Superjunction transistors can simultaneously offer high breakdown voltage and low on-resistance. Asymmetry of a superjunction transistor, however, can negatively impact blocking of high voltage control and the high breakdown voltage and the low on-resistance aspects. These and other matters have presented challenges to transistor devices, for a variety of applications.

Various example embodiments are directed to circuits that include transistors and their implementation.

SUMMARY

According to an example embodiment, an apparatus includes a substrate having a first end portion and a second end portion, which are laterally separated. Additionally, the apparatus includes at least two regions of a first semiconductor material and at least two regions of second semiconductor material. The regions of the first semiconductor material are alternatively interleaved with the regions of second semiconductor material above the substrate. The first semiconductor material has a first doping type, and the second semiconductor material has a second doping type that is different than the first doping type. Further, regions of first semiconductor material and the regions of second semiconductor material extend laterally between the first end portion and the second end portion. The apparatus also includes a first electrode on the substrate at the first end portion and a second electrode on the substrate at the second end portion. Each of the first electrode and the second electrode operate both as a source and drain. The apparatus also includes a first gate electrode having multiple portions on each of the first semiconductor material and the second semiconductor material and a second gate electrode having multiple portions on each of the first semiconductor material and the second semiconductor material. The first gate electrode and the second gate electrode are configured to bidirectionally control current flow between the first electrode and the second electrode in the first semiconductor material and the second semiconductor material by applying voltages to the first gate electrode and the second gate electrode.

Various aspects of the present disclosure are also directed toward methods that include providing a substrate having a first end portion and a second end portion. The first end portion and the second end portion are laterally separated. Additionally, the methods include providing at least two regions of a first semiconductor material and at least two regions of second semiconductor material that are alternatively interleaved above the substrate. The regions of semiconductor material also extend laterally between and the first end portion and the second end portion, and the first semiconductor material having a first doping type and the second semiconductor material having a second doping type that is different than the first doping type. Further, the methods include providing a first electrode on the substrate at the first end portion and a second electrode on the substrate at the second end portion (the first and second electrodes can operate both as a source and drain). The methods also include applying voltages to a first gate electrode having multiple portions on each of the first semiconductor material and the second semiconductor material and a second gate electrode having multiple portions on each of the first semiconductor material and the second semiconductor material to bidirectionally control current flow between the first electrode and the second electrode in the first semiconductor material and the second semiconductor material.

The above discussion/summary is not intended to describe each embodiment or every implementation of the present disclosure. The figures and detailed description that follow also exemplify various embodiments.

BRIEF DESCRIPTION OF THE DRAWINGS

Various example embodiments may be more completely understood in consideration of the following detailed description in connection with the accompanying drawings, in which.

Figure 1:
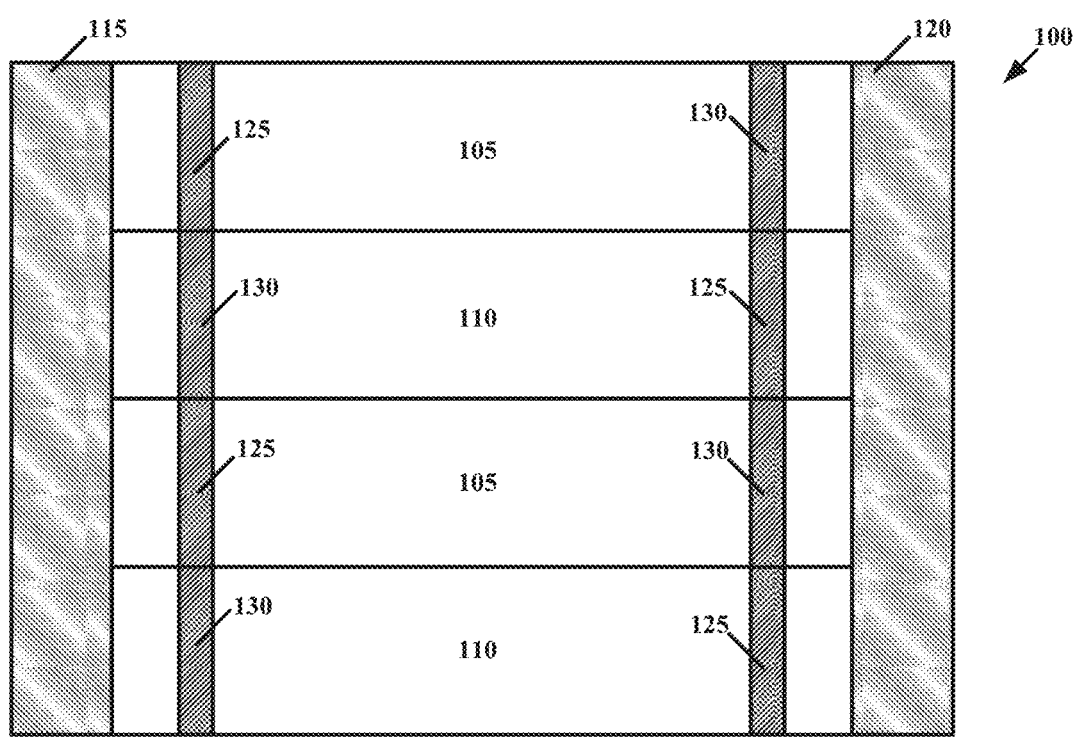
FIG. 1 shows an example superjunction apparatus, consistent with various aspects of the present disclosure.

While various embodiments discussed herein are amenable to modifications and alternative forms, aspects thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

DETAILED DESCRIPTION

Aspects of the present disclosure are believed to be applicable to a variety of different types of apparatuses, systems and methods involving apparatuses that are directed toward transistors such as symmetrical superjunction transistors. Such superjunction transistors can be used in various/different instances such as surge-protection circuits, DC-AC power converters, AC-AC power converters, capacitive DC-DC converters, multi-level audio amplifiers, and lamp dimmers. While not necessarily so limited, various aspects may be appreciated through a discussion of examples using this context.

Various example embodiments are directed to apparatuses, systems, and methods that include a substrate having a first end portion and a second end portion. The first end portion being laterally separated from the second end portion. The apparatuses, systems, and methods can also include at least two regions of a first semiconductor material and at least two regions of second semiconductor material that are alternatively interleaved above the substrate. The regions of the semiconductor material also can extend laterally between the first end portion and the second end portion. Further, the first semiconductor material can have a first doping type (and the second semiconductor material having a second doping type that is different than the first doping type). The apparatuses, systems, and methods can also include a first electrode on the substrate at the first end portion and a second electrode on the substrate at the second end portion. Each of the first electrode and the second electrode operate both as a source and drain. Moreover, the apparatuses, systems, and methods can also include a first gate electrode having multiple portions on each of the first semiconductor material and the second semiconductor material and a second gate electrode having multiple portions on each of the first semiconductor material and the second semiconductor material. The first gate electrode and the second gate electrode are configured to bidirectionally control current flow between the first electrode and the second electrode in the first semiconductor material and the second semiconductor material by applying voltages to the first gate electrode and the second gate electrode. Multiple different voltages can be simultaneously applied on the first gate electrode. In certain embodiments the multiple voltages on the first gate electrode are applied such that approximately the same amount of inversion layer is generated in each of the portions of the first semiconductor material where inversion layers can be generated by the first gate electrode. Similarly, the multiple different voltages can also be simultaneously applied to the second gate electrode.

In certain embodiments, the first gate electrode and the second gate electrode are configured to bidirectionally control current flow in response to applying different voltages to the first gate electrode and the second gate electrode. Applying different voltages creates inversion layers in the first semiconductor material and the second semiconductor material providing current flow through the inversion layers.

Other embodiments of the present disclosure include applying first voltages to the first gate electrode and second voltages to the second gate electrode. In these embodiments, the first gate electrode and the second gate electrode are configured to block voltages flowing in both directions between the first electrode and the second electrode in the first semiconductor material and the second semiconductor material when the portions of the gate electrode having voltages equal to the nearest of the first and second electrode thereby preventing inversion layer formation and preventing current flow in the first semiconductor material and the second semiconductor material. In these embodiments, currents are blocked by configuring the gate voltages such that inversion layers are removed. High voltages can be blocked by the source-drain voltage induced removal of charge carriers from the interleaved semiconductor regions that creates a larger region of depleted semiconductor material between the first and second electrodes.

Certain embodiments of the present disclosure include applying first voltages to the first gate electrode and second voltages to the second gate electrode. In these embodiments, the first gate electrode and the second gate electrode create inversion layers in the first semiconductor material near the first electrode and the second semiconductor material near the second electrode. Further, the first gate electrode is configured to fully or partially block current flow in a first direction from the second electrode to the first electrode. This allows current flow in a second direction from the first electrode to the second electrode in the inversion layers between the first electrode and the second electrode in the first and second semiconductor material when the first voltage is greater than the second voltage.

Certain embodiments of the present disclosure include applying third voltages to the first gate electrode and fourth voltages to the second gate electrode. In these embodiments, the first gate electrode is configured to create inversion layers in the first semiconductor material near the first electrode and the second semiconductor material near the second electrode and the second gate electrode is configured to fully or partially block current flow in a second direction from the first electrode to the second electrode and to allow current flow in a first direction from the second electrode to the first electrode.

Certain embodiments of the present disclosure additionally include a plurality of lateral dielectric layers. Each lateral dielectric layer is parallel to adjacent regions of the first semiconductor material and the second semiconductor material, and disposed at boundaries of the adjacent regions of the first semiconductor material and the second semiconductor material. In certain more specific embodiments, these dielectric layers separate regions of the first semiconductor material and the second semiconductor material below the first gate electrode and the second gate electrode. In yet another more specific embodiment, at least two adjacent regions of the first semiconductor material and the second semiconductor material include two regions of the first semiconductor material and two regions of the second semiconductor material, and the lateral dielectric layers separate the adjacent regions of the first semiconductor material and the second semiconductor material. Additionally, other embodiments of the present disclosure include a first semiconductor material and a second semiconductor material that have a higher doping concentration nearer the first end portion and the second end portion than away from the first end portion and the second end portion. Additionally, certain embodiments of the present disclosure can include a buried oxide layer disposed on the substrate and between the substrate and the at least two adjacent regions of the first semiconductor material and the second semiconductor material.

In certain embodiments of the present disclosure the first and second semiconductor material are made out of doped silicon and the oxides are made out of silicon oxide. The gate electrodes are separated from the semiconductor material by a thin gate oxide made out of silicon oxide.

Other embodiments of the present disclosure are further characterized in that the substrate, the first semiconductor material, the second semiconductor material, the first electrode, the second electrode, the first gate electrode and the second gate electrode have mirror symmetry in a plane that is perpendicular to both the top surface of the semiconductor material and the plane that forms the boundary between the at least two adjacent regions of the first semiconductor material and the second semiconductor material.

The embodiments and specific applications discussed herein may be implemented in connection with one or more of the above-described aspects, embodiments and implementations, as well as with those shown in the appended figures.

Turning now to the figures, FIG. 1 shows an example superjunction apparatus 100, consistent with various aspects of the present disclosure. The superjunction apparatus 100 includes two regions of a first semiconductor material 105 and two regions of second semiconductor material 110. As shown in FIG. 1, the two regions of a first semiconductor material 105 and two regions of second semiconductor material 110 are alternatively interleaved. Additionally, the first semiconductor material 105 is of a first doping type (e.g., n-type) and the second semiconductor material 110 is of a second doping type (different than the first doping type, e.g., p-type). The superjunction apparatus 100 also includes a first electrode 115 and a second electrode 120 disposed at separate end portions of the superjunction apparatus 100. The first electrode 115 and the second electrode 120 operate both as a source and drain. In certain embodiments the first and second electrodes consist of semiconductor material covered by a metal. Moreover, the two regions of a first semiconductor material 105 and two regions of second semiconductor material 110 laterally extend between the first electrode 115 and the second electrode 120.

The superjunction apparatus 100 also includes a first gate electrode 125 and a second gate electrode 130. The first gate electrode 125 and the second gate electrode 130 each include multiple portions on each of the first semiconductor material 105 and the second semiconductor material 110. Further, the first gate electrode 125 and the second gate electrode 130 are configured to bidirectionally control current flow between the first electrode 115 and the second electrode 120 in the first semiconductor material 105 and the second semiconductor material 110 by applying voltages to the first gate electrode 125 and the second gate electrode 130. In certain embodiments, semiconductor regions below the gate electrodes 125 and 130 are of opposite doping type to the neighboring regions 105 and 110.

Figure 2:
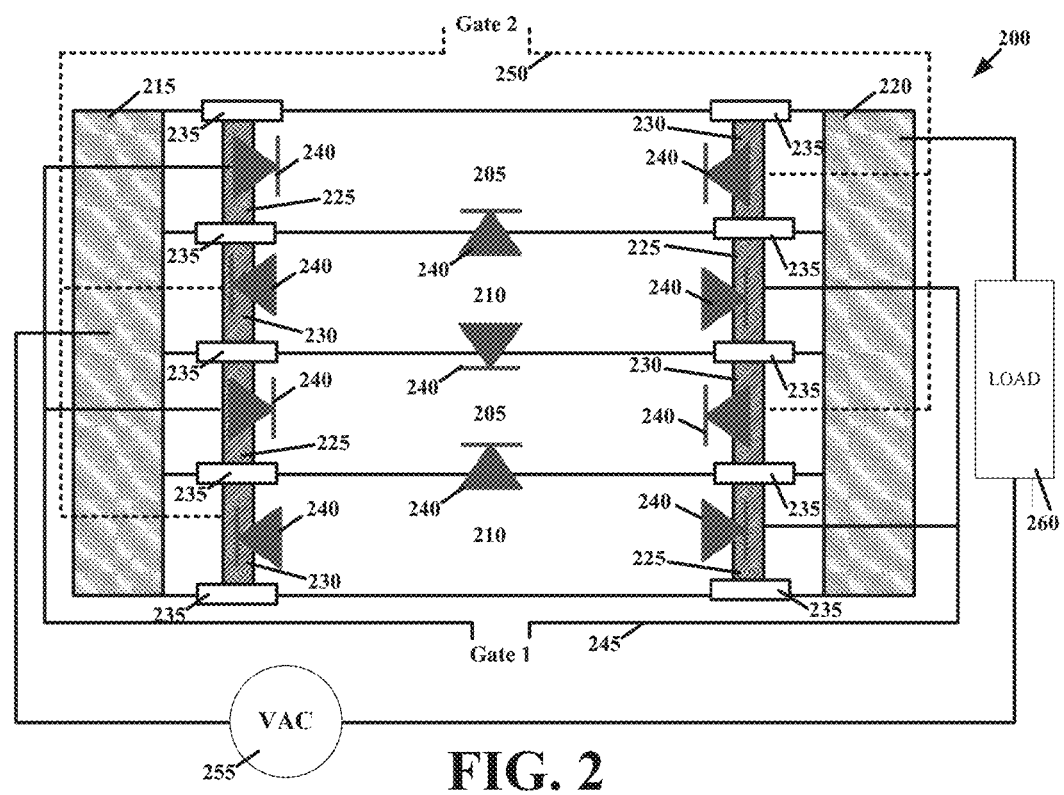
FIG. 2 shows another example superjunction apparatus, consistent with various aspects of the present disclosure.

FIG. 2 shows another example superjunction apparatus, consistent with various aspects of the present disclosure. Similar to the apparatus shown in FIG. 1, the apparatus 200 shown in FIG. 2 includes two regions of a first semiconductor material 205 (of a first doping type) and two regions of second semiconductor material 210 (of a second and different doping type); a first electrode 215 and a second electrode 220; and a first gate electrode 225 and a second gate electrode 230 that each include multiple portions. The apparatus 200 also includes multiple portions of the dielectric layers 235. Each of the portions of the dielectric layers 235 are parallel to adjacent regions of the first semiconductor material 205 and the second semiconductor material 210 and disposed at boundaries of the adjacent regions of the first semiconductor material 205 and the second semiconductor material 210.

The apparatus 200 is shown in the off-state based on the voltages supplied to the multiple portions of the first gate electrode 225 and the multiple portions of the second gate electrode 230. This is represented by diodes 240 between interleaved regions that are reverse biased and depleted as a result of the voltages applied. The diodes 240 are superjunction diodes that are reverse-biased and depleted. The apparatus 200 includes a first gate control circuitry 245 and a second gate control circuitry 250 to respectively apply voltages to the multiple portions of the first gate electrode 225 and the multiple portions of the second gate electrode 230. A voltage source 255 supplies voltage, connected through a load 260, to the first electrode 215 and the second electrode 220. As a result, the multiple portions of the first gate electrode 225 and the multiple portions of the second gate electrode 230 bidirectionally control current flow between the first electrode 215 and the second electrode 220 in the first semiconductor material 205 and the second semiconductor material 210.

Figure 3:
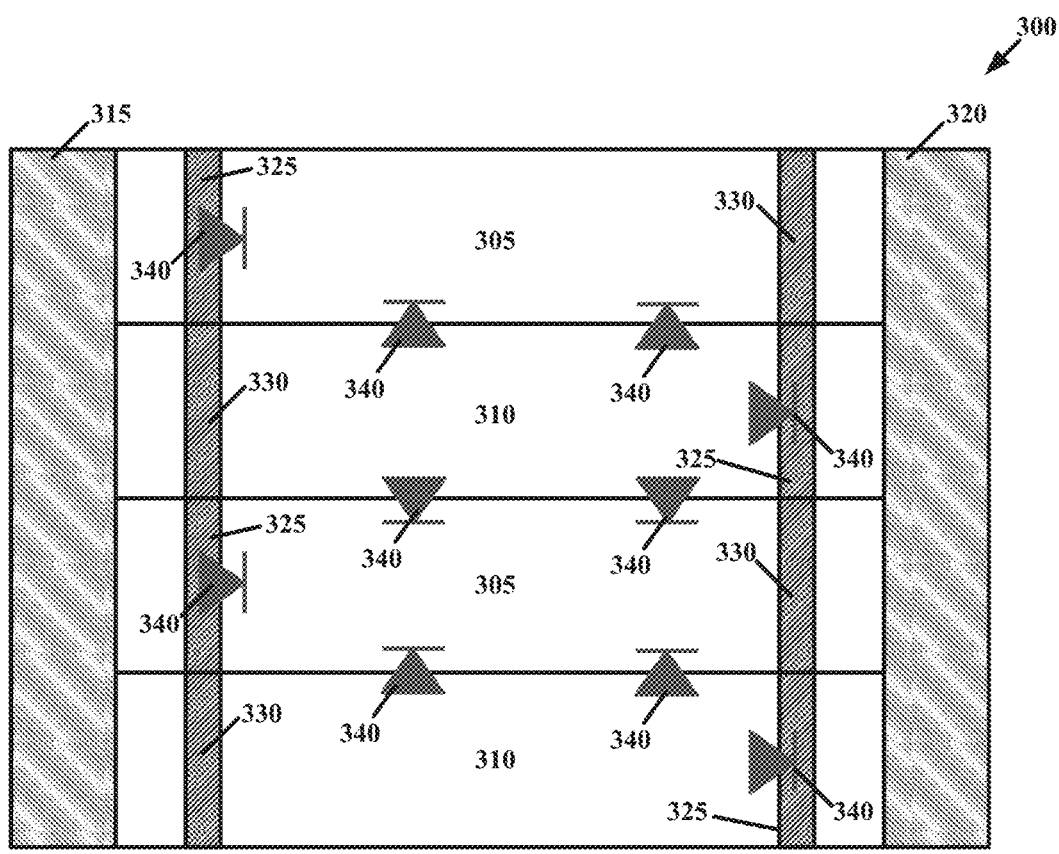
FIG. 3 shows an example superjunction apparatus in an operational mode, consistent with various aspects of the present disclosure.
Figure 4:
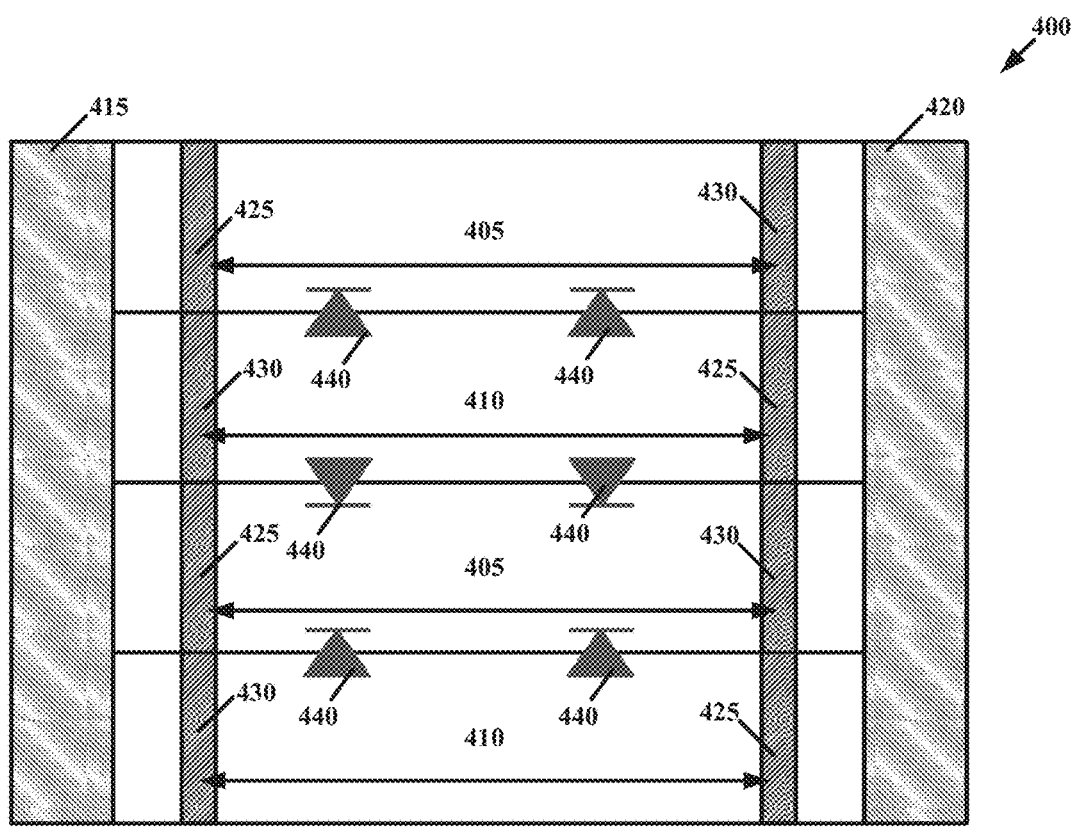
FIG. 4 shows example superjunction apparatuses in operational modes, consistent with various aspects of the present disclosure.
Figure 5:
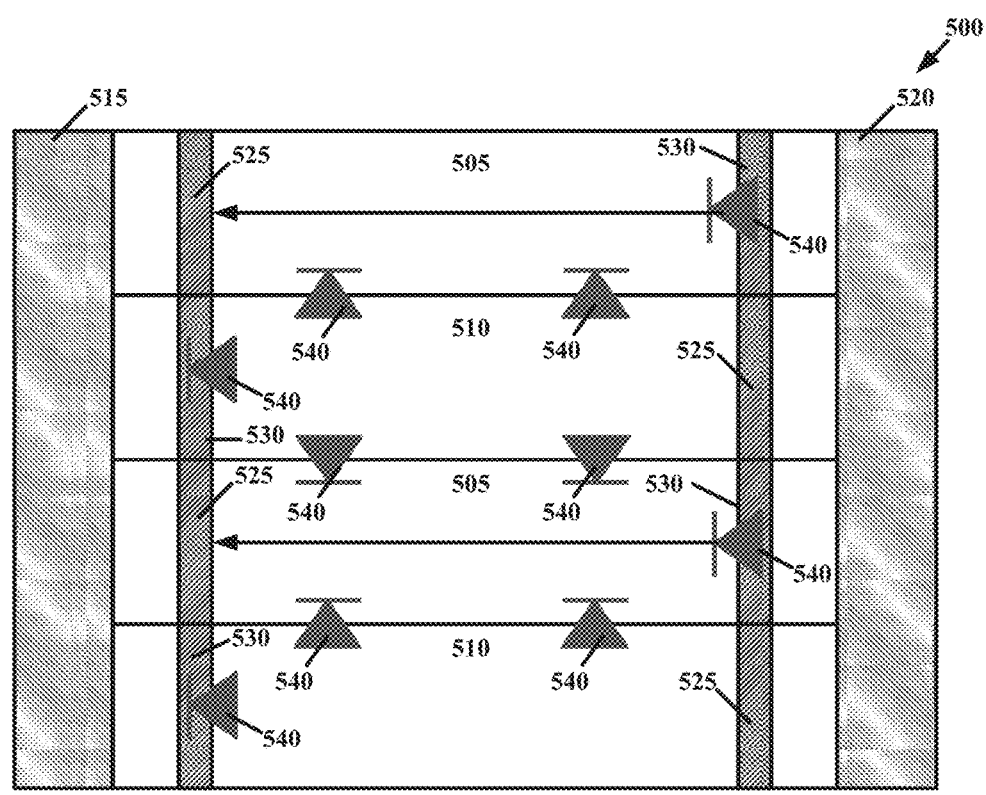
FIG. 5 shows another example superjunction apparatus in another operational mode, consistent with various aspects of the present disclosure.

The apparatus 200 blocks high voltages in both directions. High voltages occur when the voltage as applied to the first electrode 215 is greater than the voltage applied to the second electrode 220, and vice versa. The apparatus 200 is configured to block high voltages when no inversion layers are generated in the portions of the first 225 and second 230 gate electrodes. In the off-state, no inversion layers are generated by the gate electrodes when the gate voltage is equal to the voltage at the nearest neighboring terminal. Thus, the apparatus 200 is in an off-state when: (1) the gate voltage on the portions of the first gate electrode 225 on the left side of the apparatus 200 is equal to the voltage on the first electrode 215 and the gate voltage on the portions of the first gate electrode 225 on the right side of the apparatus 200 is equal to the voltage on the second electrode 220; and (2) the gate voltage on the portions of the second gate electrode 230 on the left side of the apparatus 200 is equal to the voltage on the first electrode 215 and the gate voltage on the portions of the second gate electrode 230 on the right side of the apparatus 200 is equal to the voltage on the second electrode 220. Additionally, when the voltage 220 is larger than on terminal 215 the diodes 240 are depleted and the width of the depletion region increases laterally from left to the right, thus enabling a wide depletion region at a relatively high doping level. Additionally, when the voltage 220 is smaller than on terminal 215 the diodes 240 are depleted and the width of the depletion region increases laterally from right to left, thus enabling a wide depletion region at a relatively high doping level. As a consequence of this design, the apparatus 200 has a low on-resistance value (due to high doping levels) in on-state (e.g., as shown in FIGS. 4 and 5) and high breakdown voltage in off-state (e.g., as shown in FIG. 3) (due to a wide depletion region). In off-state, no inversion layers are present in the device and current is blocked in both directions and both the gate voltages on the first gate electrode 220 and the second gate electrode 230 are off, in other words the gate voltage on each of the gate controlled region is equal to the voltage on the nearest of the first 215 or second 220 electrode.

FIG. 3 shows an example superjunction apparatus 300 in an operational mode, consistent with various aspects of the present disclosure. The superjunction apparatus 300 shown in FIG. 3 includes two regions of a first semiconductor material 305 (of a first doping type) and two regions of second semiconductor material 310 (of a second and different doping type); a first electrode 315 and a second electrode 320; and a first gate electrode 325 and a second gate electrode 330 that each include multiple portions. Diodes 340 demonstrate the blocking of high voltages. In the embodiment shown in FIG. 3, the device blocks current when the voltage on the first electrode 320 is greater than the voltage on the second electrode 315, when no inversion layers are generated below regions 325. Moreover, the device conducts current when the voltage on the first electrode 315 is greater than that of 320 by at least the diode's threshold value because inversion layers are generated by in the semiconductor portions controlled by the second gate electrode 330.

The on-voltage is the (positive) voltage needed to bring the device into the on-state (corresponding to a low on-resistance). The control voltage is an arbitrary voltage between zero and the on-voltage. When the voltage on the second electrode 320 is higher than that on the first electrode 315, the current can be increased (significantly above the off-state current) by generating increasing inversion layers with the first gate electrode 325 when: (1) the gate voltage on the portions of the first gate electrode 325 on the left side of the superjunction apparatus 300 is increased by the control voltage above the voltage on the first electrode 315, and the gate voltage on the portions of the first gate electrode 325 on the right side of the superjunction apparatus 300 is decreased by the control voltage below the voltage on the second electrode 320; and (2) maximum inversion layers are generated by setting the gate voltage on the portions of the second gate electrode 330 on the left side of the superjunction apparatus 300 equal to the voltage on the first electrode 315 minus the on-voltage (of the apparatus 300), and the gate voltage on the portions of the second gate electrode 330 on the right side of the superjunction apparatus 300 is equal to the voltage on the second electrode 320 plus the on-voltage.

The channels controlled by the first gate electrode 325 are controlling current, and the channels controlled by the second gate electrode 330 are conducting the current. For the control voltage being equal to zero, no current flows, and for the control voltage being equal to the on-voltage, the current is large, until maximum current flows (e.g., as shown in FIG. 4).

FIG. 4 shows an example superjunction apparatus 400 in operational modes, consistent with various aspects of the present disclosure. The superjunction apparatus 400 shown in FIG. 4 includes two regions of a first semiconductor material 405 (of a first doping type) and two regions of second semiconductor material 410 (of a second and different doping type); a first electrode 415 and a second electrode 420; and a first gate electrode 425 and a second gate electrode 430 that each include multiple portions. Diodes 440 demonstrate the blocking of high voltages. The apparatus shown in FIG. 4 is in the on-state configuration has a low on-resistance.

The on-voltage is the (positive) voltage needed to bring the device into the on-state (corresponding to a low on-resistance). Current can flow in both directions when: (1) the gate voltage on the portions of the first gate electrode 425 on the left side of the superjunction apparatus 400 is equal to the voltage on the first electrode 415 plus the on-voltage and the gate voltage on the portions of the first gate electrode 425 on the right side of the superjunction apparatus 400 is equal to the voltage on the second electrode 420 minus the on-voltage; and (2) the gate voltage on the portions of the second gate electrode 430 on the left side of the superjunction apparatus 400 is equal to the voltage on the first electrode 415 minus the on-voltage and the gate voltage on the portions of the second gate electrode 430 on the right side of the superjunction apparatus 400 is equal to the voltage on the second electrode 420 plus the on-voltage. Both the gate voltages on the first gate electrode 425 and the second gate electrode 430 are on. In the embodiment shown in FIG. 4, the control voltage (described above with reference to FIG. 3) is equal to the on-voltage.

FIG. 5 shows another example superjunction apparatus 500 in another operational mode, consistent with various aspects of the present disclosure. The superjunction apparatus 500 shown in FIG. 5 includes two regions of a first semiconductor material 505 (of a first doping type) and two regions of second semiconductor material 510 (of a second and different doping type); a first electrode 515 and a second electrode 520; and a first gate electrode 525 and a second gate electrode 530 that each include multiple portions. Diodes 540 demonstrate the blocking of high voltages. In the embodiment shown in FIG. 5, the voltage on the first electrode 515 is greater than the voltage on the second electrode 520.

The on-voltage is the (positive) voltage needed to bring the device into the on-state (corresponding to a low on-resistance). The control voltage is an arbitrary voltage between zero and the on-voltage. Current can be controlled by the second gate electrode 530 when: (1) the gate voltage on the portions of the first gate electrode 530 on the left side of the superjunction apparatus 500 is equal to the voltage on the first electrode 515 minus the control voltage and the gate voltage on the portions of the second gate electrode 530 on the right side of the superjunction apparatus 500 is equal to the voltage on the second electrode 520 plus the control voltage; and (2) the gate voltage on the portions of the second gate electrode 525 on the left side of the superjunction apparatus 500 is equal to the voltage on the first electrode 515 plus the on-voltage and the gate voltage on the portions of the second gate electrode 525 on the right side of the superjunction apparatus 500 is equal to the voltage on the second electrode 520 minus the on-voltage.

The channels controlled by the second gate electrode 530 are controlling current, and the channels controlled by first gate electrode 525 are conducting the current. For the control voltage being equal to zero, no current flows, and for the control voltage being equal to the on-voltage, the current is large, and maximum current flows. Additionally, current can flow along the arrows in FIG. 5, however, in normal operation the voltage can be reversed (V1>V2). In this situation, the diode would block the voltage and the gate voltage on the second gate electrode 530 which would be used to create an inversion layer to let the current flow in the direction opposite to the arrows. Currents that flow through a diode have more dissipation/resistance than currents that can flow through an inversion layer.

The doping types are shown in the figures by the different shading of the semiconductor layers, which aids in the operational description of the apparatuses, including the directions of the diodes shown therein. For instance, one shading can be an n-type doped region, and the other can be a p-type doped region. Further, the n-type doped regions have donor doping, positively charged ions in the depleted state and an excess negative charge-carrier concentration in the un-depleted state.

Figure 6:
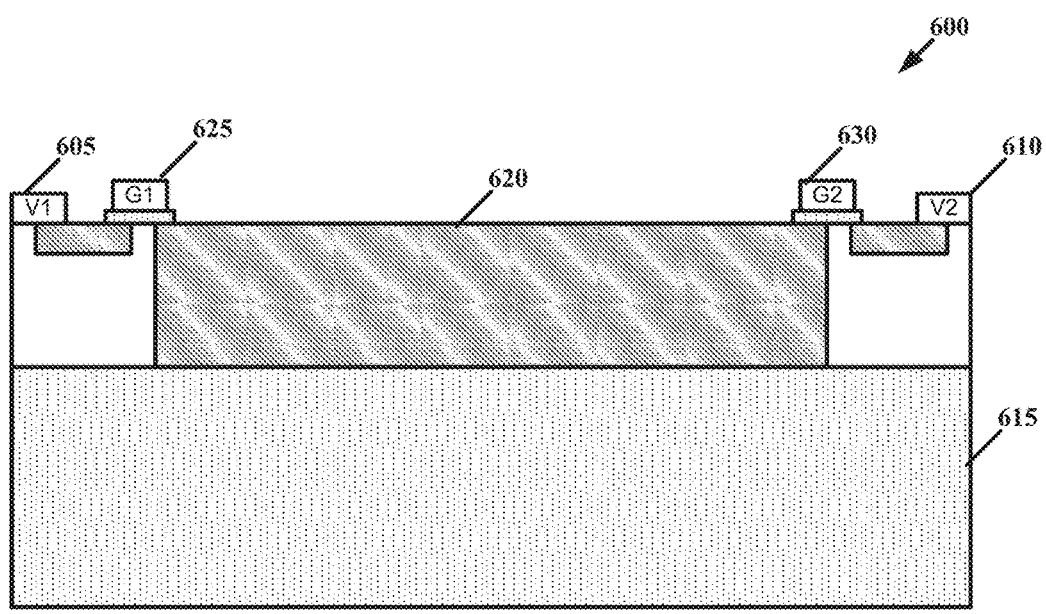
FIG. 6 shows a cross-section of an example superjunction apparatus, consistent with various aspects of the present disclosure.

FIG. 6 shows a cross-section of an example superjunction apparatus 600, along the direction of current flow, consistent with various aspects of the present disclosure. The superjunction apparatus 600 includes a first electrode 605 and a second electrode 610 disposed at end regions of the apparatus 600. The substrate includes a buried oxide region 615. Above the buried oxide region 615 are two regions of a first semiconductor material and two regions of second semiconductor material that are alternatively interleaved semiconductor materials 620 (e.g., as shown above in FIGS. 1-5). The apparatus 600 shown in FIG. 6 is shown as a cross-section, thus, the semiconductor materials 620 are not shown as interleaved as in the above described figures. At the ends of the regions of the semiconductor materials 620 are a first gate electrode 625 and a second gate electrode 630. The first gate electrode 625 and the second gate electrode 630 are separated from the semiconductor material by a thin gate oxide layers, thus preventing current flow. The semiconductor material below this gate oxide is partially of an opposite doping type than the main region of the semiconductor materials 620. The first and second electrodes 605 and 610 electrically contact both types of semiconductor material.

In certain embodiments, the second semiconductor material is doped by addition of acceptor ions to the material (p-type doping) that increases the concentration of positively charged charge-carriers (holes) in the material, whereas the first semiconductor material is doped by addition of donor ions that increases the concentration of negatively charged charge-carriers (electrons). In another embodiment, the total doped charge of the charge-carriers in the alternatively interleaved regions of the first semiconductor material is of equal magnitude and of opposite sign to the total charge of the doped charge-carriers in the alternatively interleaved regions of the second semiconductor material. In this embodiment, the sum of the total charge of all charge-carriers in both the first and second semiconductor materials can be approximately zero, or at least more than a factor 10 lower than the total charge in either the first or second semiconductor materials in the interleaved regions alone.

In certain embodiments, the interleaved and alternating regions of semiconductor material regions includes greater than two laterally interleaved bars or stripes of a p-type and n-type doped semiconductor material, and at least one sandwiched bar or stripe of the other of p-type and n-type doped semiconductor material. In these embodiments, each of the bars are connected to an end portion of the same material. As a result, for example, at least two p-type and one n-type bar create a superjunction effect. Each of the bars having small regions of semiconductor material of opposite polarity in which an inversion layer can be created using a gate electrode. Further, one of these regions is nearer the first end portion and the other region being nearer the second end portion, and each of these regions can be separated from a gate electrode by a thin insulating gate dielectric.

Certain other embodiments of the present disclosure including injecting charge carriers at both electrodes (e.g., the first and second electrodes shown in FIG. 1) depending on the gate configuration. More specifically, either electrons can be injected from the n-type material or holes injected from the p-type material. Thus, in such embodiments, a source and a drain electrode are indistinguishable from the geometry because the electrodes and the accompanying apparatus are completely symmetric and the direction of current flow can be fully controlled by adjusting the voltages on the gate terminals with respect to the voltage on the first and second electrode.

Further, the gate electrodes shown above in FIGS. 1-6 can have four different gate electrodes each having a different gate voltage. However, in such an embodiment, the gate voltages are switched in groups of two. Thus, the effective number of gates is two, and as a result, there can be $2^2=4$ modes of operation.

Although various aspects of the present disclosure are described in terms of in-plane current flow and laterally interleaved semiconductor regions, various embodiments can be applied to stacked semiconductor regions or regions that extend in a direction perpendicular to the substrate surface, thus enabling current flow perpendicular to the wafer surface.

In certain embodiments, the apparatuses described herein can be used as an AC-AC converter, AC dimming, AC motor control, AC over-voltage/surge/ESD protection circuits using crowbars, multi-level DC-AC converters such as audio amplifiers, and capacitive DC-DC converters. Additionally, the power stage in capacitive DC-DC converters can include power switches and capacitors, where the switches connect the capacitors in various parallel and series constellations in different clock phases. In capacitive DC-DC converters the voltage polarity across the transistors used as power switches vary during operation. As a result a power switch that needs to remain non-conducting needs to block current in both directions, so for positive or negative voltage polarity across the non-conducting switch. Alternatively, a switch may need to be turned on (conducting state) with either a high source or a high drain potential, depending on the state of the circuit. The proposed device can be switched on (conducting state) when either source is higher than drain (V1>V2) or vice versa (V2>V1) using a single switch device.

As described herein, the apparatuses, systems, and methods of the present disclosure can block and conduct current in both directions. Thus, as compared to transistors that are connected back-to-back, the apparatus described herein can have a four factor lower on-resistance than the back-to-back-connected transistors. This lower on-resistance can result for current conduction in both p- and n-type regions. Further, in certain embodiments, the apparatuses described herein can replace thyristors and triodes for alternating current (TRI-ACs) by a MOSFET equivalent device, which allows for additional control features as thyristors switch off when the current becomes zero. However, with a gate as in a MOSFET you can switch the channel on or off at each moment, and therefore, there are greater control possibilities.

In certain embodiments, the current-blocking capability of the various apparatuses described herein can be in two directions that could also be offered by placing two transistors back-to-back in a series. However, considering that the on-resistance of a transistor is given partially by the channel resistance and partially by the drift resistance, the apparatuses describe herein can offer an area reduction with respect to a back-to-back connection of two transistors.

Additionally, the apparatuses of the present disclosure can be used in Multi-level class-D amplifier design such as audio amplifiers, because it allows size and cost reduction of the passive LC filter. Additionally, the apparatuses of the present disclosure can also be used as power switches can be found in AC-AC converters.

Various blocks, modules or other circuits may be implemented to carry out one or more of the operations and activities described herein and/or shown in the figures. In these contexts, a "block" (also sometimes "logic circuitry" or "module") is a circuit that carries out one or more of these or related operations/activities (e.g., the control circuitry shown in FIG. 2). For example, in certain of the above-discussed embodiments, one or more modules are discrete logic circuits or programmable logic circuits configured and arranged for implementing these operations/activities, as in the circuit modules shown in FIG. 2.

Based upon the above discussion and illustrations, those skilled in the art will readily recognize that various modifications and changes may be made to the various embodiments without strictly following the exemplary embodiments and applications illustrated and described herein. Such modifications do not depart from the true spirit and scope of various aspects of the invention, including aspects set forth in the claims.

The invention claimed is:
1. An apparatus comprising:
a substrate having a first end portion and a second end portion, the first end portion being laterally separated from the second end portion;
at least two regions of a first semiconductor material and at least two regions of second semiconductor material being alternatively interleaved above the substrate and extending laterally between the first end portion and the second end portion, the first semiconductor material having a first doping type and the second semiconductor material having a second doping type that is different than the first doping type;
a first electrode on the substrate at the first end portion and a second electrode on the substrate at the second end portion, each of the first electrode and the second electrode being configured and arranged to operate both as a source and drain;

a first gate electrode having multiple portions adjacent the first end portion on each of the first semiconductor material and the second semiconductor material and multiple portions adjacent the second end portion on each of the first semiconductor material and the second semiconductor material; and a second gate electrode having multiple portions adjacent the first end portion on each of the first semiconductor material and the second semiconductor material and multiple portions adjacent the second end portion on each of the first and second semiconductor material, wherein the first gate electrode and the second gate electrode are configured and arranged to bidirectionally control current flow between the first electrode and the second electrode in the first semiconductor material and the second semiconductor material by applying voltages to the first gate electrode and the second gate electrode.

2. The apparatus of claim 1, wherein the first gate electrode and the second gate electrode are configured and arranged to bidirectionally control current flow in response to applying different voltages to the first gate electrode and the second gate electrode thereby creating inversion layers in the first semiconductor material and the second semiconductor material providing current flow through the inversion layers.

3. The apparatus of claim 1, wherein first voltages are applied to the first gate electrode and second voltages are applied to the second gate electrode, and the first gate electrode and the second gate electrode are further configured and arranged to block voltages flowing in both directions between the first electrode and the second electrode in the first semiconductor material and the second semiconductor material when the portions of the gate electrode having voltages equal to the nearest of the first and second electrode thereby preventing inversion layer formation and preventing current flow in the first semiconductor material and the second semiconductor material.

4. The apparatus of claim 1, wherein first voltages are applied to the first gate electrode and second voltages are applied to the second gate electrode, and the second gate electrode is further configured and arranged to create inversion layers in the first semiconductor material near the first electrode and the second semiconductor material near the second electrode and the first gate electrode is further configured and arranged to fully or partially block current flow in a first direction from the second electrode to the first electrode and to allow current flow in a second direction from the first electrode to the second electrode in the inversion layers between the first electrode and the second electrode in the first and second semiconductor material when the first voltage is greater than the second voltage.

5. The apparatus of claim 1, wherein third voltages are applied to the first gate electrode and fourth voltages are applied to the second gate electrode, and the first gate electrode further configured and arranged to create inversion layers in the first semiconductor material near the first electrode and the second semiconductor material near the second electrode and the second gate electrode is further configured and arranged to fully or partially block current flow in a second direction from the first electrode to the second electrode and to allow current flow in a first direction from the second electrode to the first electrode.

6. The apparatus according to claim 1, further including a plurality of lateral dielectric layers, each lateral dielectric layer being parallel to adjacent regions of the first semiconductor material and the second semiconductor material and disposed at boundaries of the adjacent regions of the first semiconductor material and the second semiconductor material.

7. The apparatus of claim 6, wherein the at least two adjacent regions of the first semiconductor material and the second semiconductor material includes two regions of the first semiconductor material and two regions of the second semiconductor material.

8. The apparatus of claim 7, wherein the plurality of lateral dielectric layers separate regions of the first semiconductor material and the second semiconductor material below the first gate electrode and the second gate electrode.

9. The apparatus according to claim 1, wherein the first semiconductor material and the second semiconductor material have a higher doping concentration nearer the first end portion and the second end portion than away from the first end portion and the second end portion.

10. The apparatus according to claim 1, further including a buried oxide layer disposed on the substrate and between the substrate and the at least two adjacent regions of the first semiconductor material and the second semiconductor material.

11. The apparatus according to claim 1, wherein the substrate, the first semiconductor material, the second semiconductor material, the first electrode, the second electrode, the first gate electrode and the second gate electrode have mirror symmetry in a plane that is perpendicular to both the top surface of the semiconductor material and the plane that forms the boundary between the at least two adjacent regions of the first semiconductor material and the second semiconductor material.

12. A power converter being a one of the set consisting of a DC-AC power converter, an AC-AC power converter, and a capacitive DC-DC converter, and comprising an apparatus according to claim 1.

13. The apparatus according to claim 6, wherein the plurality of lateral dielectric layers are disposed between adjacent portions of the first gate electrode and the second gate electrode.

14. The apparatus of claim 1, further comprising a plurality of dielectric layers disposed between adjacent portions of the first gate electrode and the second gate electrode.

15. The apparatus of claim 1, further comprising a plurality of dielectric layers adjacent the first end portion, the plurality of dielectric layers separating respective portions of the first gate electrode and the second gate electrode.

16. The apparatus of claim 1, further comprising a plurality of dielectric layers adjacent the second end portion, the plurality of dielectric layers separating respective portions of the first gate electrode and the second gate electrode.

17. A method comprising:
providing a substrate having a first end portion and a second end portion, the first end portion being laterally separated from the second end portion;
providing at least two regions of a first semiconductor material and at least two regions of second semiconductor material being alternatively interleaved above the substrate and extending laterally between and the first end portion and the second end portion, the first semiconductor material having a first doping type and the second semiconductor material having a second doping type that is different than the first doping type;

providing a first electrode on the substrate at the first end portion and a second electrode on the substrate at the second end portion, each of the first electrode and the second electrode being configured and arranged to operate both as a source and drain;

applying voltages to a first gate electrode having multiple portions adjacent the first end portion on each of the first semiconductor material and the second semiconductor material and multiple portions adjacent the second end portion on each of the first semiconductor material and the second semiconductor material; and applying voltages to a second gate electrode having multiple portions adjacent the first end portion on each of the first semiconductor material and the second semiconductor material and multiple portions adjacent the second end portion on each of the first semiconductor material and the second semiconductor material to bidirectionally control current flow between the first electrode and the second electrode in the first semiconductor material and the second semiconductor material.

18. The method of claim 17, wherein the step of applying voltages includes at least one of (a) applying different voltages to the multiple portions of the first gate electrode and the second gate electrode thereby creating one or more inversion layers in one or more of the first semiconductor material and the second semiconductor material providing current flow through the inversion layers, and (b) applying different voltages to the first gate electrode and the second gate electrode thereby creating inversion layers in the first semiconductor material and the second semiconductor material providing current flow through the inversion layers.

19. The method of claim 18 in which the step of applying voltages includes at least one of applying different voltages to the multiple portions of the first gate electrode and the second gate electrode thereby creating one or more inversion layers in one or more of the first semiconductor material and the second semiconductor material providing current flow through the inversion layers, wherein applying the different voltages includes applying four independent voltages to different ones of the multiple portions of the first gate electrode and the second gate electrode thereby creating one or more inversion layers in one or more of the first semiconductor material and the second semiconductor material providing current flow through the inversion layers.

20. The method of claim 17, further comprising providing a plurality of dielectric layers adjacent the first end portion, the plurality of dielectric layers separating respective portions of the first gate electrode and the second gate electrode.

* * * * *